US007911185B2

(12) United States Patent
Yonezawa (10) Patent No.: US 7,911,185 B2
(45) Date of Patent: Mar. 22, 2011

(54) BATTERY VOLTAGE DETECTION CIRCUIT (75) Inventor: Yoshiaki Yonezawa, Oizumi-machi (JP)

(73) Assignees: Sanyo Electric Co., Ltd., Osaka (JP); Sanyo Semiconductor Co. Ltd., Gunma (JP)

( * ) Notice: Subject to any disclaimer, the term of this patent is extended or adjusted under 35 U.S.C. 154(b) by 308 days.

(21) Appl. No.: 12/358,096

(22) Filed: Jan. 22, 2009

(65) Prior Publication Data

US 2009/0184716 A1    Jul. 23, 2009

(30) Foreign Application Priority Data

Jan. 23, 2008   (JP) ................................. 2008-012944

(51) Int. Cl.
*H02J 7/00*      (2006.01)
*H02M 3/00*     (2006.01)
*H02M 3/24*     (2006.01)
*H01H 35/00*    (2006.01)

(52) U.S. Cl. ........ 320/166; 320/148; 320/149; 320/156; 320/157; 320/162; 307/109; 307/112; 307/130; 307/131; 363/59; 363/74; 363/76; 363/84

(58) Field of Classification Search .................... 320/166
See application file for complete search history.

(56) References Cited

U.S. PATENT DOCUMENTS

| | | | | |
|---|---|---|---|---|
| 6,621,273 B2 * | 9/2003 | Takada et al. | ................. | 324/433 |
| 2001/0054881 A1 * | 12/2001 | Watanabe | ..................... | 320/166 |
| 2005/0104560 A1 * | 5/2005 | Pai | ................................. | 320/166 |
| 2005/0285573 A1 * | 12/2005 | Cheng | ........................... | 320/166 |
| 2006/0170463 A1 * | 8/2006 | Yonezawa et al. | ............ | 327/101 |

FOREIGN PATENT DOCUMENTS

JP    2002-243771    8/2002

* cited by examiner

*Primary Examiner* — Edward Tso
*Assistant Examiner* — Yalkew Fantu
(74) *Attorney, Agent, or Firm* — SoCal IP Law Group LLP; Steven C. Sereboff; John E. Gunther (57) ABSTRACT

A battery-voltage detection circuit comprising: a first-capacitor; an operational-amplifier; a second-capacitor; a voltage-application-circuit to sequentially apply one and the other-battery-terminal-voltages to the other-first-capacitor-end; a discharge circuit to allow the second-capacitor to discharge before the other-battery-terminal-voltage is applied to the other-first-capacitor-end; a constant current circuit to output a constant-current causing predetermined-speed-discharge of electric charge accumulated in the second-capacitor in response to a discharge-start-signal input after voltage is applied to the other-first-capacitor-end; a comparator; and a measurement-circuit to measure a time-period from a time when the discharge-start-signal is input until a time when an comparator-output-signal changes to one logic level as a time-period corresponding to a battery-voltage, at least one of the operational-amplifier and the comparator being provided with an offset so that the comparator-output-signal changes to the one logic level when voltage applied to the other operational-amplifier input terminal is at a predetermined level lower than a reference-voltage level.

5 Claims, 6 Drawing Sheets

BATTERY VOLTAGE DETECTION CIRCUIT

CROSS-REFERENCE TO RELATED APPLICATION

This application claims the benefit of priority to Japanese Patent Application No. 2008-012944, filed Jan. 23, 2008, of which full contents are incorporated herein by reference.

BACKGROUND OF THE INVENTION

1. Field of the Invention

The present invention relates to a battery voltage detection circuit.

2. Description of the Related Art

Figure 7:
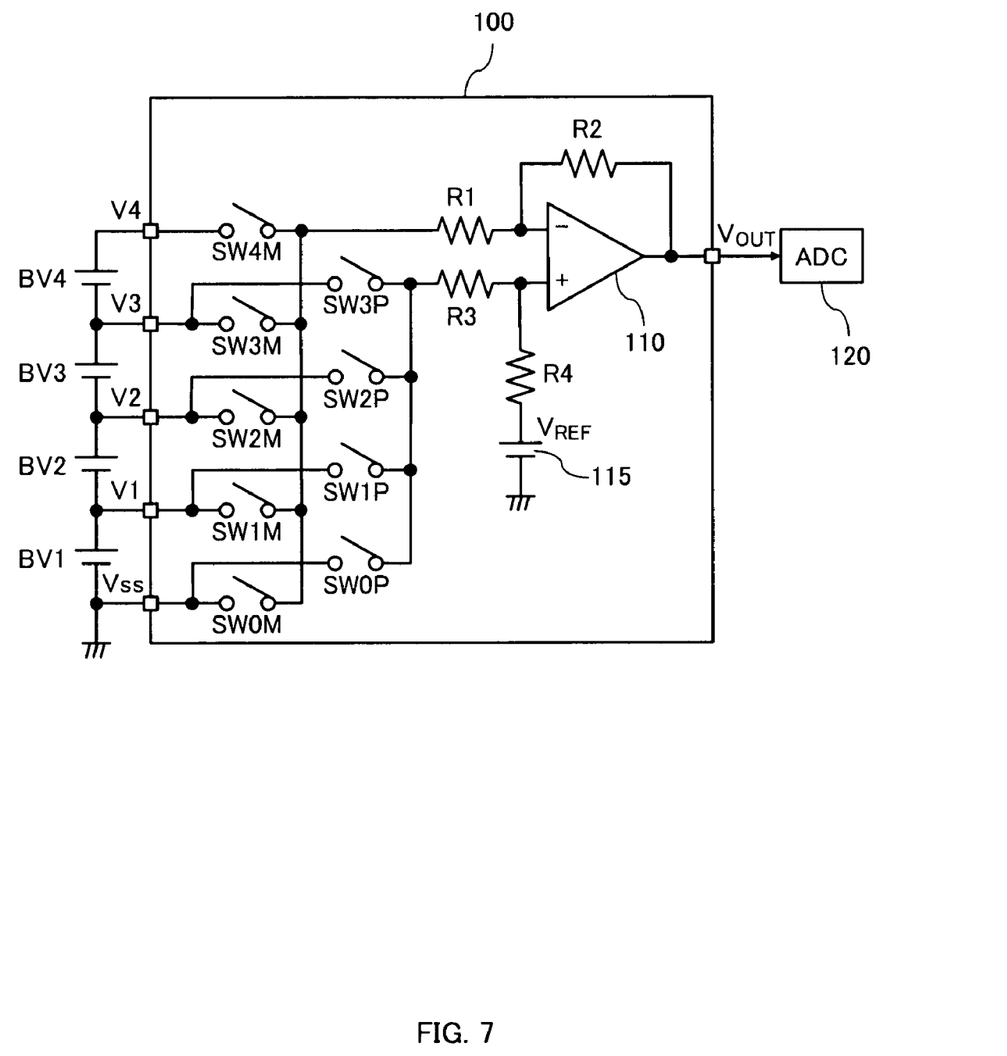
FIG. 7 is a diagram of a typical configuration of a battery voltage detection circuit.

Devices such as a notebook computer using rechargeable batteries must accurately detect voltages of the batteries to control charging/discharging of the batteries connected in series. FIG. 7 depicts a typical configuration of a battery voltage detection circuit (see Japanese Patent Application Laid-Open Publication No. 2002-243771). A battery voltage detection circuit 100 is a circuit for detecting voltages of four batteries BV1 to BV4 connected in series and includes an operational amplifier 110, resistors R1 to R4, switches SW0M to SW4M, SW0P to SW3P, and a power source 115 that outputs a reference voltage $V_{REF}$. When detecting a voltage $V_{BV4}$ of the battery BV4 in such battery voltage detection circuit 100, the switches SW4M and SW3P are turned on and other switches are turned off. As a result, a voltage $V_{OUT}$ is output from the operational amplifier 110 to an AD converter (ADC) 120 according to a difference between a voltage V4 of the positive side terminal of the battery BV4 and a voltage V3 of the negative side terminal thereof. The voltage $V_{BV4}$ of the battery BV4 may be detected by converting the voltage $V_{OUT}$ into a digital value with the ADC 120. Similarly, a voltage $V_{BV3}$ of the battery BV3 may be detected by turning on the switches SW3M and SW2P and turning off other switches. A voltage $V_{BV2}$ of the battery BV2 may be detected by turning on the switches SW2M and SW1P and turning off other switches. A voltage $V_{BV1}$ of the battery BV1 may be detected by turning on the switches SW1M and SW0P and turning off other switches.

When lithium-ion batteries are used for the batteries BV1 to BV4, each of the voltages $V_{BV1}$ to $V_{BV4}$ across their respective batteries BV1 to BV4 reaches nearly 4.5 V when fully charged. If it is assumed that the voltages $V_{BV1}$ to $V_{BV4}$ of the batteries BV1 to BV4 are set to 5 V in consideration of allowance in design, the batteries BV1 to BV4 connected in series generate a total voltage of 20 V, and thus, the battery voltage detection circuit 100 needs high voltage endurance. On the other hand, circuits for control systems including the ADC 120 typically use a power supply voltage of about 3.3 V, and a voltage $V_{OUT}$ output from the battery voltage detection circuit 100 must be 3.3 V or less.

If the resistors R3 and R4 have resistance values of R3 and R4, respectively, a gain $G_{AMP}$ of the operational amplifier 110 is expressed by R4/R3. Therefore, the voltage $V_{OUT}$ output when detecting the voltage $V_{BV4}$ of the battery BV4 is expressed by $V_{OUT}=V_{BV4}G_{AMP}+V_{REF}=(V4-V3)R4/3+V_{REF}$. Assuming that $V_{BV4}$ is 5 V and $V_{REF}$ is 0.2 V, a condition of the gain $G_{AMP}$ of the operational amplifier 110 for achieving $V_{OUT} \leq 3.3$ V is expressed by $G_{AMP} \leq (V_{OUT}-V_{REF})/V_{BV4}=(3.3-0.2)/5 \approx 0.6$. Therefore, the voltage $V_{OUT}$ output to the ADC 120 may be set to a voltage of 3.3 V or less by selecting the resistance values of the resistors R3 and R4 such that the gain $G_{AMP}$ of the operational amplifier 110 is set to about 0.6. However, the operational amplifier 110 needs the high voltage endurance in this case, and thus, the costs of the battery voltage detection circuit 100 is increased.

To eliminate the need for the high voltage endurance in the operational amplifier 110, a voltage applied to the operational amplifier 110 is required to be 3.3 V or less. That is, to set a voltage $V^+$ applied to a positive input terminal of the operational amplifier 110 to 3.3 V or less, $(V3-V_{REF})R4/(R3+R4)+V_{REF} \leq 3.3$ is required to be satisfied. This leads to $R4/(R3+R4) \leq (3.3-V_{REF})/(V3-V_{REF})=(3.3-0.2)/(15-0.2)=3.1/14.8 \approx 0.21$. Therefore, the gain $G_{AMP}$ of the operational amplifier 110 is $G_{AMP}=R4/R3 \leq 0.21/(1-0.21) \approx 0.26$. Therefore, the need for the high voltage endurance in the operational amplifier 110 may be eliminated by selecting the resistance values of the resistors R3 and R4 such that the gain $G_{AMP}$ of the operational amplifier 110 is set to about 0.26. However, since the gain $G_{AMP}$ of the operational amplifier 110 is small in this case, the voltage $V_{OUT}$ input to the ADC 120 is reduced. Therefore, the highly-accurate ADC is necessary to accurately detect the battery voltages, resulting in increase in costs.

Furthermore, in the battery voltage detection circuit 100, a current is passed through the resistors R1 and R3 respectively connected to the input terminals of the operational amplifier when detecting the voltages of the batteries BV1 to BV4. Therefore, in order to restrain discharge from the batteries BV1 to BV4 due to this current, the resistors R1 and R3 needs large resistances of the order of a few megohms. In order to accurately detect the voltages of the batteries BV1 to BV4, the resistors R1 to R4 are required to have less voltage dependency in resistance values. Thus, when producing an integrated circuit including such resistors having large resistance values and less voltage dependency, a special processing is necessary, resulting in increase in costs.

SUMMARY OF THE INVENTION

A battery voltage detection circuit according to an aspect of the present invention, comprises: A battery voltage detection circuit comprising: a first capacitor; an operational amplifier having one input terminal to be applied with a reference voltage and the other input terminal connected to one end of the first capacitor; a second capacitor having one end connected to an output terminal of the operational amplifier and the other end connected to the other input terminal of the operational amplifier; a voltage application circuit configured to sequentially apply a voltage of one terminal of a battery and a voltage of the other terminal of the battery to the other end of the first capacitor; a discharge circuit configured to allow the second capacitor to discharge before the voltage of the other terminal of the battery is applied to the other end of the first capacitor; a constant current circuit configured to output a constant current causing electric charge accumulated in the second capacitor to be discharged at a predetermined speed, in response to a discharge start signal input after the voltage is applied to the other end of the first capacitor; a comparator having one input terminal to be applied with the reference voltage and the other input terminal connected to the output terminal of the operational amplifier; and a measurement circuit configured to measure a time period from a time when the discharge start signal is input until a time when an output signal of the comparator changes to one logic level, as a time period corresponding to a voltage of the battery, at least one of the operational amplifier and the comparator being provided with an offset so that the output signal of the comparator changes to the one logic level when the voltage applied to the other input terminal of the operational amplifier is a voltage of a predetermined level lower than a level of the reference voltage.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

First Embodiment

=Circuit Configuration=

Figure 1:
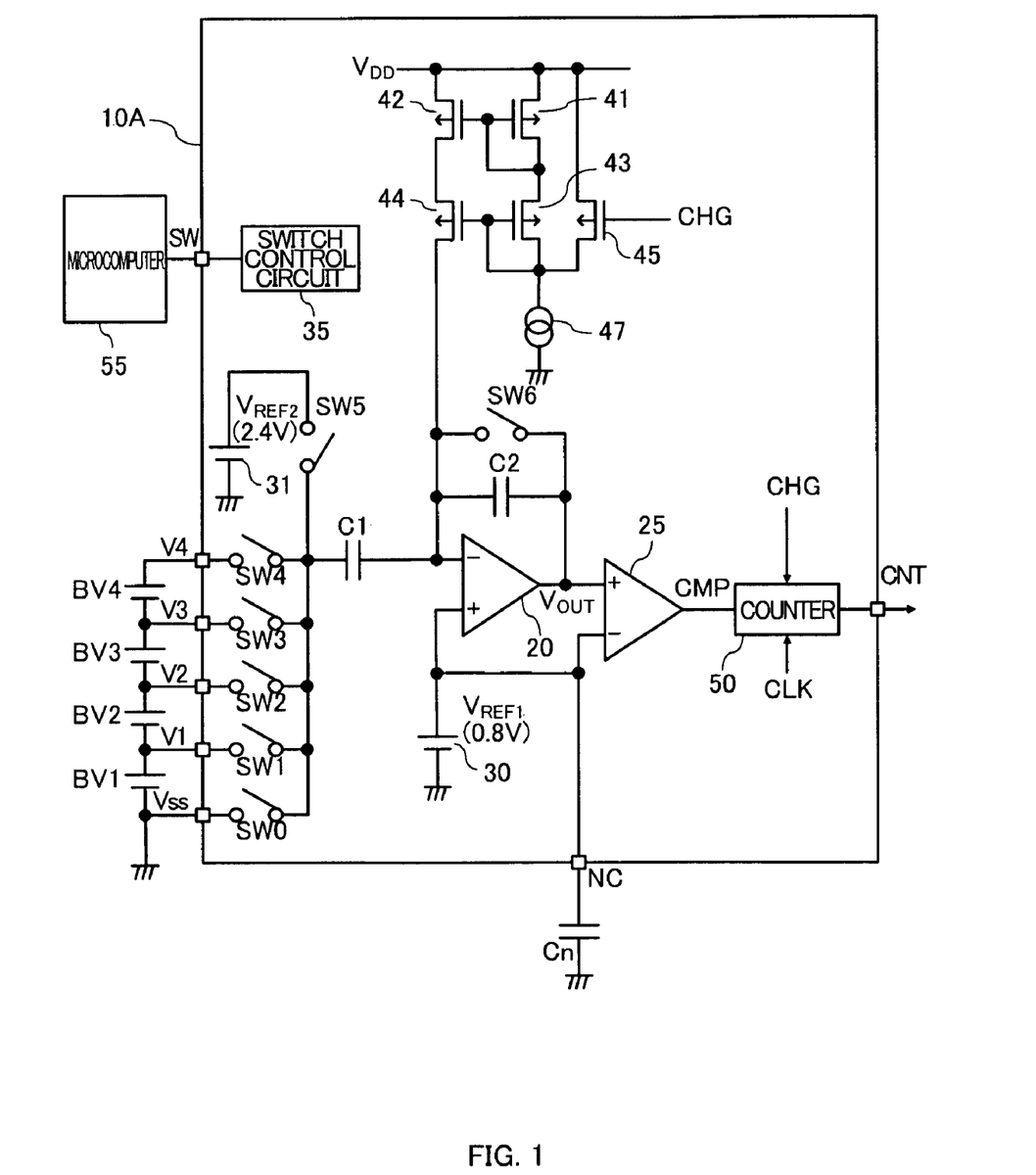
FIG. 1 is a diagram of a configuration of a battery voltage detection circuit that is a first embodiment of the present invention.

FIG. 1 depicts a configuration of a battery voltage detection circuit that is a first embodiment of the present invention. A battery voltage detection circuit 10A is a circuit for detecting voltages of four batteries BV1 to BV4 connected in series and includes an operational amplifier 20, a comparator 25, capacitors C1, C2, switches SW0 to SW6, power sources 30, 31, a switch control circuit 35, P-channel MOSFETs 41 to 45, a current source 47, and a counter 50.

Figure 2:
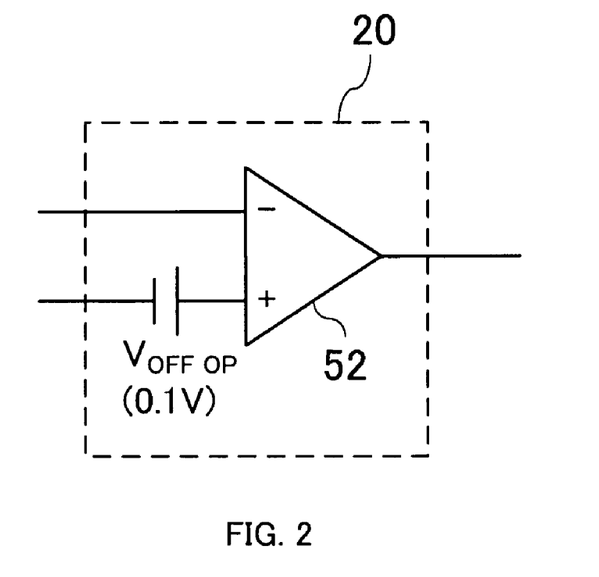
FIG. 2 is a diagram of an equivalent circuit of an operational amplifier.

The operational amplifier 20 has a positive input terminal to be applied with a reference voltage $V_{REF}$ output from the power source 30 and a negative input terminal connected to one end of the capacitor C1. Since the capacitor C1 is connected to the negative input terminal of the operational amplifier 20 and a direct-current voltage is not applied thereto, the operational amplifier 20 may not needs the high voltage endurance. Unlike typical operational amplifiers which are so designed as to eliminate offsets, the operational amplifier 20 is provided with an offset so that a voltage of the negative input terminal is higher than a voltage of the positive input terminal by about 0.1 V, for example. FIG. 2 depicts an equivalent circuit of the operational amplifier 20. The operational amplifier 20 may be expressed such that an ideal operational amplifier 52 without offset has, for example, 0.1 V of an offset voltage $V_{OFFOP}$ applied to the positive input terminal thereof. As a result, a voltage $V_{REF1}+V_{OFFOP}$ obtained by adding the offset voltage $V_{OFFOP}$ to the reference voltage $V_{REF1}$ is applied to the positive input terminal of the operational amplifier 52, and the operational amplifier 52 operates using the voltage $V_{REF1}+V_{OFFOP}$ as a reference voltage. A typical operational amplifier uses transistors of the same sizes, for example, to enhance symmetry of a differential transistor pair, etc. On the other hand, in the operational amplifier 20, for example, sizes may intentionally be set imbalanced in two transistors, which make up a differential transistor pair having control electrodes serving as a positive input terminal and a negative input terminal, so that the offset can positively provided. A method of providing the offset is not limited to this, and various methods may be used such as changing sizes of resistors that should normally have the same sizes or adding a current source so that current flows become imbalanced.

Figure 3:
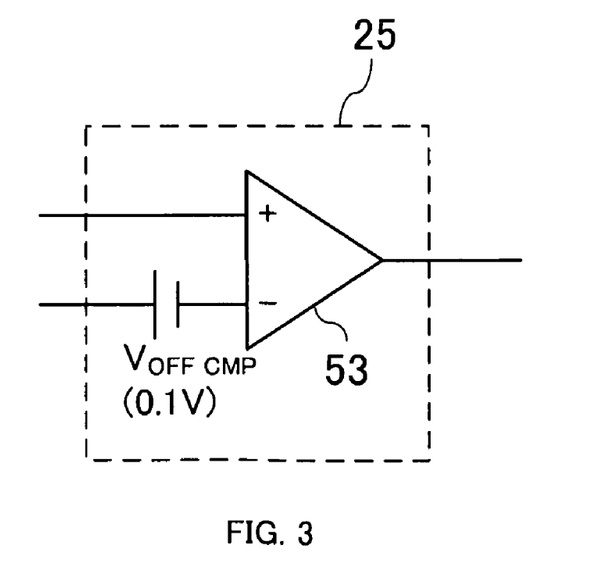
FIG. 3 is a diagram of an equivalent circuit of a comparator.

The comparator 25 outputs a signal CMP that indicates a result of comparison between the output voltage $V_{OUT}$ of the operational amplifier 20 to be applied to a positive input terminal and the reference voltage $V^{REF}$ output from the power source 30 to be applied to a negative input terminal. Unlike typical comparators so designed as to eliminate offsets, the comparator 25 is provided with an offset so that a logic level of the signal CMP is changed when the positive input terminal becomes lower in voltage than the negative input terminal by about 0.1 V, for example. FIG. 3 depicts an equivalent circuit of the comparator 25. The comparator 25 may be expressed such that an ideal comparator 53 without offset has, for example, 0.1 V of an offset voltage $V_{OFFCMP}$ applied to the negative input terminal. As a result, a voltage $V_{REF1}-V_{OFFCMP}$ obtained by subtracting the offset voltage $V_{OFFCMP}$ from the reference voltage $V_{REF1}$ is applied to the negative input terminal of the comparator 53, and the comparator 53 operates using the voltage $V_{REF1}-V_{OFFCMP}$ as a reference voltage. The offset may be applied to the comparator 25 by various methods, for example, by intentionally setting sizes imbalanced in two transistors, which make up the differential transistor pair having control the electrodes serving as the positive input terminal and the negative input terminal, as is the case with the operational amplifier 20.

The capacitor C1 (first capacitor) has one end connected to the negative input terminal of the operational amplifier 20 and the other end connected to each of the switches SW0 to SW5 at each one end. The capacitor C2 (second capacitor) has one end connected to an output terminal of the operational amplifier 20 and the other end connected to the negative input terminal of the operational amplifier 20. Assuming that lithium-ion batteries are used for the batteries BV1 to BV4, each of the voltages $V_{BV1}$ to $V_{BV4}$ across their respective batteries BV1 to BV4 reaches nearly 4.5 V when fully charged. If it is assumed that the voltages $V_{BV1}$ to $V_{BV4}$ of the batteries BV1 to BV4 are set to 5 V in consideration of allowance in design, the batteries BV1 to BV4 connected in series generate a total voltage of 20 V, and thus, the capacitor C1 needs high voltage endurance. Therefore, in an embodiment of the present invention, the capacitors C1 and C2 are made up using wiring capacitance having less voltage dependency in general.

The switch SW0 has one end thereof connected to the other end of the capacitor C1 and has the other end thereof connected through a terminal $V_{SS}$ to the negative terminal of the battery BV1. The switch SW1 has one end thereof connected to the other end of the capacitor C1 and has the other end thereof connected through a terminal V1 to the positive terminal of the battery BV1 and the negative terminal of the battery BV2. The switch SW2 has one end thereof connected to the other end of the capacitor C1 and has the other end connected thereof through a terminal V2 to the positive terminal of the battery BV2 and the negative terminal of the battery BV3. The switch SW3 has one end thereof connected to the other end of the capacitor C1 and has the other end thereof connected through a terminal V3 to the positive terminal of the battery BV3 and the negative terminal of the battery BV4. The switch SW4 has one end thereof connected to the other end of the capacitor C1 and has the other end thereof connected through a terminal V4 to the positive terminal of the battery BV4. The switch SW5 has one end thereof connected to the output terminal of the operational amplifier 20 and has the other end thereof connected to the negative input terminal of the operational amplifier 20. The switch SW5 has one end thereof connected to the other end of the capacitor C1 and has the other end thereof applied with a reference voltage $V_{REF2}$ output from the power source 31. The switch SW6 is connected between the both ends of the capacitor C2. The switches SW0 to SW5 correspond to a voltage application circuit according to an embodiment of the present invention and the switch SW6 corresponds to a discharge circuit according to an embodiment of the present invention.

The power source 30 is a power source circuit that outputs the reference voltage $V_{REF1}$ and the power source 31 is a power source circuit that outputs the reference voltage $V_{REF2}$. A capacitor Cn for noise cutting is connected through a terminal NC to the power source 30 in order to restrain fluctuations of the power source 30 due to noises. Although the capacitor Cn is used for noise cutting in an embodiment of the present invention, a method of noise cutting is not limited to this, and various techniques may be used such as shielding the wirings of the power source 30, for example. It is assumed in an embodiment of the present invention that $V_{REF1}$=0.8 V and $V_{REF2}$=2.4 V.

The switch control circuit 35 controls the switches SW0 to SW6 as to ON/OFF based on a signal input thorough a terminal SW from a microcomputer 55. A function equivalent to that of the switch control circuit 35 may be implemented by software.

The P-channel MOSFET 41 has the source thereof applied with a power source voltage $V_{DD}$, the drain thereof connected to the source of the P-channel MOSFET 43, and the gate thereof connected to the drain thereof. The P-channel MOSFET 42 has the source thereof applied with the power source voltage $V_{DD}$, the drain thereof connected to the source of the P-channel MOSFET 44, and the gate thereof connected to the gate of the P-channel MOSFET 41. The P-channel MOSFET 43 has the source thereof connected to the drain of the P-channel MOSFET 41, the drain thereof connected to the current source 47, and the gate thereof connected to the drain thereof. The P-channel MOSFET 44 has the source thereof connected to the drain of the P-channel MOSFET 42, the drain thereof connected to the other end of the capacitor C2 (on the side of the negative input terminal of the operational amplifier 20), and the gate thereof connected to the gate of the P-channel MOSFET 43. The P-channel MOSFET 45 has the source thereof applied with the power source voltage $V_{DD}$, the drain thereof connected to the current source 47, and the gate thereof to which the signal CHG is input. That is, the P-channel MOSFETs 41 to 44 make up a current mirror circuit, and when the signal CHG is high, the P-channel MOSFET 45 is turned off and a constant current flows toward the capacitor C2 according to a constant current output from the current source 47.

There are input to the counter 50 (measurement circuit) the signal CHG output from the switch control circuit 35, the signal CMP output from the comparator 25, and a clock signal CLK with a predetermined frequency generated by, for example, an RC oscillation circuit. The counter 50 starts counting of the clock signal CLK when the signal CHG changes from low to high and stops counting when the signal CMP changes from high to low.

=Operation=

Figure 4:
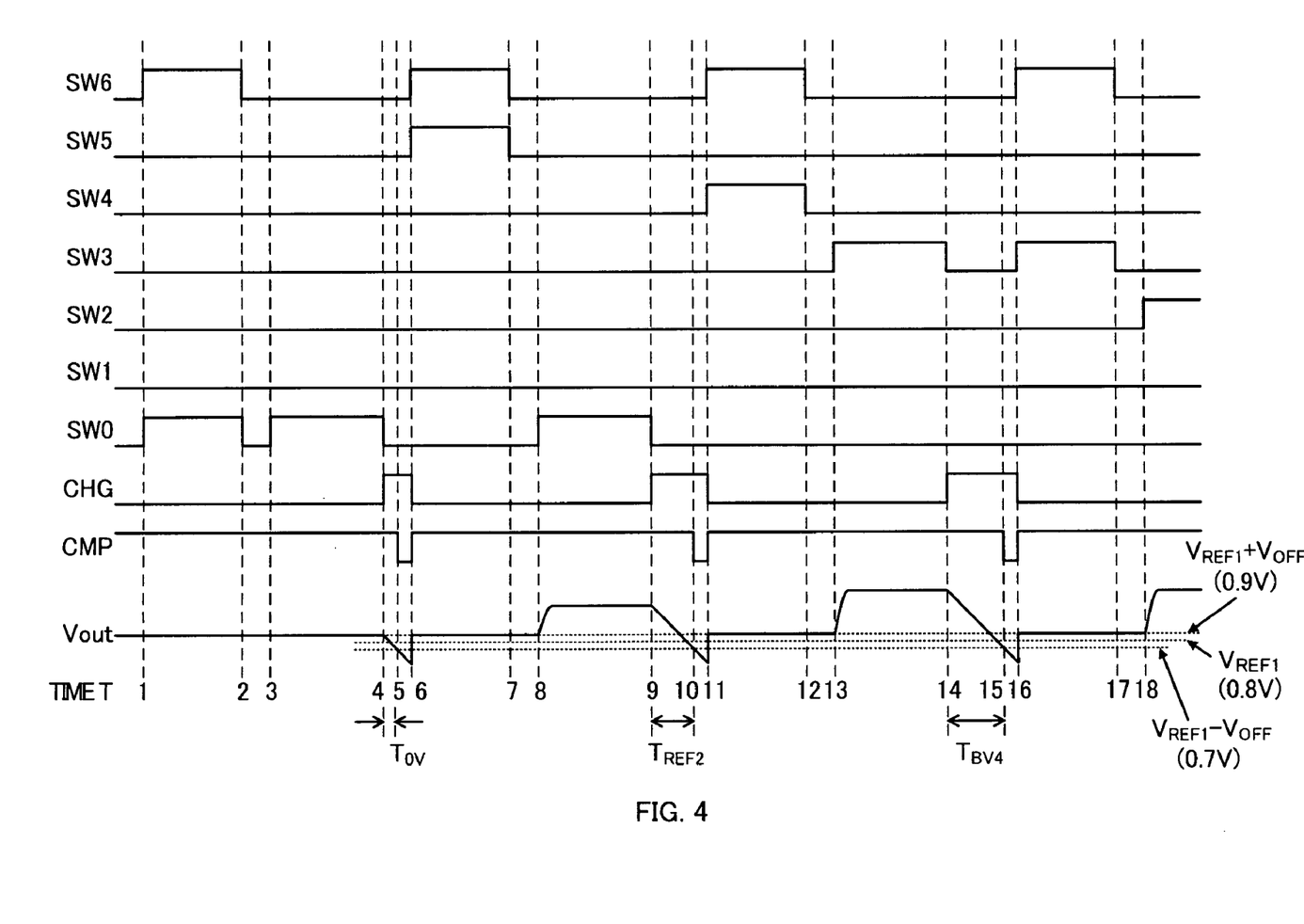
FIG. 4 is a timing chart of an example of an operation of the battery voltage detection circuit of a first embodiment.

An operation of the battery voltage detection circuit 10A will then be described. FIG. 4 is a timing chart of an example of the operation of the battery voltage detection circuit 10A. The voltages applied to the terminals V1 to V4 are denoted as V1 to V4, respectively. The voltages of the batteries BV1 to BV4 are denoted as $V_{BV1}$ to $V_{BV4}$, respectively, and the capacitances of the capacitors C1 and C2 are denoted as C1 and C2, respectively. It is assumed that, for switches SW0 to SW6, a turned-on state corresponds to high and a turned-off state corresponds to low. The offset voltages of the operational amplifier 20 and the comparator 25 are assumed to be $V_{OFFOP}$=$V_{OFFCMP}$=0.1 V, respectively. For convenience in explanation, the offset voltages of the operational amplifier 20 and the comparator 25 will be expressed as $V_{OFF}$.

At time T1, the switches SW0 and SW6 are turned on and the switches SW1 to SW5 are turned off. Since the switch SW6 is turned on, the capacitor C2 discharges and a voltage $V_{C2}$ across the capacitor C2 is set to 0 V. Since the switch SW6 is turned on, the operational amplifier 20 acts as an amplifier having a gain 1. Since the offset of the operational amplifier 20 is 0.1 V, the output voltage $V_{OUT}$ of 0.9 V is output, which is obtained by adding the offset voltage $V_{OFF}$ to the reference voltage $V_{REF1}$ applied to the positive input terminal. Since the offset of the comparator 25 is 0.1 V, a threshold voltage of the comparator 25 is set to 0.7 V, which is lower than the reference voltage $V_{REF1}$ by the offset voltage $V_{OFF}$, and the output signal CMP remains high. Since the switch SW0 is turned on, the ground voltage $V_{SS}$ (=0 V) is applied to one end of the capacitor C1.

Thereafter, the switches SW0 and SW6 are turned off at time T2 and then the switch SW0 is turned on again at time T3. At this time, since a voltage applied to one end of the capacitor C1 is the ground voltage same as that between times T1 and T2, the electric charge is not changed in the capacitor C1. Therefore, the electric charge is not changed in the capacitor C2 and the output voltage $V_{OUT}$ remains at 0.9 V.

The switch SW0 is turned off at time T4 and the signal CHG goes high. Since the signal CHG (discharge start signal) goes high, the P-channel MOSFET 45 is turned off and a constant current according to the current generated by the current source 47 flows from the P-channel MOSFET 44 through the capacitor C2 toward the output terminal of the operational amplifier 20. This constant current causes the capacitor C2 to discharge at a constant speed, and the output voltage $V_{OUT}$ is reduced at a constant speed. Since the signal CHG goes high, the counter 50 starts counting up of a count value CNT based on the clock signal CLK.

Thereafter, when the output voltage $V_{OUT}$ becomes lower than 0.7 V which is the threshold voltage of the comparator 25 at time T5, the output signal CMP goes low and the counter 50 stops counting. As a result of this, the microcomputer 55 can measure time $T_{0V}$ between times T4 and T5. The measured time $T_{0V}$ is a time corresponding to the grounding voltage $V_{SS}$ (=0 V). When the signal CHG goes low at time T6, the P-channel MOSFET 45 is turned on and discharging of the capacitor C2 caused by the constant current stops.

In the battery voltage detection circuit 10A, the operational amplifier 20 and the comparator 25 are provided with the offsets, so that 0 V may be measured. That is, when assuming the offsets of the operational amplifier 20 and the comparator 25 are set to zero, the output voltage $V_{OUT}$ is equal to the reference voltage $V_{REF1}$ during a time period between the times T1 and T4, and thus, it becomes impossible to perform counting of the time corresponding to 0 V. Therefore, when the offsets of the operational amplifier 20 and the comparator 25 are set to zero, a power source outputting a voltage (e.g., 0.7 V) lower than the reference voltage $V_{REF1}$ may be provided separately from the power source 30, for example, and this lower voltage may be applied to the negative input terminal of the comparator 25 so that 0 V can be detected. However, a countermeasure of noise cutting must be taken for the power source separately provided in order to enhance detection accuracy, and thus, the costs may be increased. On the other hand, in the battery voltage detection circuit 10A according to an embodiment of the present invention, the operational amplifier 20 and the comparator 25 are applied with the offsets, so that 0 V can be detected using only the power source 30, and thus, costs may be reduced.

At time T6, the switches SW5 and SW6 are turned on. Since the switch SW6 is turned on, the voltage $V_{C2}$ across the capacitor C2 is set to 0 V, the output voltage $V_{OUT}$ is set to 0.9 V, and the output signal CMP of the comparator 25 goes high. Since the switch SW5 is turned on, the reference voltage $V_{REF2}$ output from the power source 31 is applied to one end of the capacitor C1, and a voltage $V_{C1}$ across the capacitor C1 is set to $V_{C1}=V_{REF2}-V_{REF1}-V_{OFF}$.

Thereafter, the switches SW5 and SW6 are turned off at time T7 and then the switch SW0 is turned on at time T8. As a result, the ground voltage $V_{SS}$ is applied to one end of the capacitor C1, a current flows from the output terminal of the operational amplifier 20 through the capacitor C2, the capacitor C1, and the switch SW0 toward the terminal $V_{SS}$ in this order and the electric charge corresponding to the reference voltage $V_{REF2}$ is accumulated in the capacitor C2, so that the output voltage $V_{OUT}$ is increased.

While the electric charge of the capacitor C1 is in a stable state, $V_{C1}=V_{SS}-V_{REF1}-V_{OFF}$ is satisfied. Therefore, a variation $\Delta Q_{C1}$ of an electric charge $Q_{C1}$ of the capacitor C1 is expressed by $\Delta Q_{C1}=(V_{REF2}-V_{REF1}-V_{OFF})\cdot C1-(V_{SS}-V_{REF}-V_{OFF})\cdot C1=V_{REF2}\cdot C1$. Since the electric charge same as $\Delta Q_{C1}$ is accumulated in the capacitor C2, an electric charge $Q_{C2}$ of the capacitor C2 is expressed by $Q_{C2}=V_{REF2}\cdot C1$. Therefore, the voltage $V_{C2}$ across the capacitor C2 is expressed by $V_{C2}=V_{REF2}\cdot C1/C2$, and the output voltage $V_{OUT}$ is expressed by $V_{OUT}=V_{REF1}+V_{OFF}+V_{C2}=V_{REF1}+V_{OFF}+V_{REF2}\cdot C1/C2$.

At time T9, the switch SW0 is turned off and the signal CHG goes high. Since the signal CHG goes high, the P-channel MOSFET 45 is turned off and a constant current according to the current generated by the current source 47 flows from the P-channel MOSFET 44 through the capacitor C2 toward the output terminal of the operational amplifier 20. This constant current causes the electric charge accumulated in the capacitor C2 to be discharged at a constant speed, and the output voltage $V_{OUT}$ is reduced at a constant speed. Since the signal CHG goes high, the counter 50 starts counting up of the count value CNT based on the clock signal CLK.

Thereafter, when the output voltage $V_{OUT}$ becomes lower than the threshold voltage 0.7 V $(=V_{REF1}-V_{OFF})$ of the comparator 25 at time T10, the output signal CMP of the comparator 25 goes low and the counter 50 stops counting. As a result of this, the microcomputer 55 can measure time $T_{REF2}$ between times T9 and T10. When the signal CHG goes low at time T11, the P-channel MOSFET 45 is turned on and the discharging of the capacitor C2 caused by the constant current stops.

At time T11, the switches SW4 and SW6 are turned on. Since the switch SW6 is turned on, the output voltage $V_{OUT}$ is set to 0.9 V $(=V_{REF1}+V_{OFF})$, and the output signal CMP of the comparator 25 goes high. At this time, the threshold voltage of the comparator 25 is 0.7 V $(=V_{REF1}-V_{OFF})$ while the output voltage $V_{OUT}$ is 0.9 V $(=V_{REF1}+V_{OFF})$, and thus, a voltage difference of $2\times V_{OFF}$ is generated between the positive input terminal and the negative input terminal of the comparator 25. Therefore, when the switch SW6 is turned on, occurrence of chattering may be restrained in the output signal $V_{CMP}$ of the comparator 25. Since the switch SW6 is turned on, the voltage $V_{C2}$ across the capacitor C2 is set to $V_{C2}=0$ V. Since the switch SW4 is turned on, the voltage $V_{C1}$ across the capacitor C1 is expressed by $V_{C1}=V4-V_{REF1}-V_{OFF}$.

Thereafter, the switches SW4 and SW6 are turned off at time T12 and then the switch SW3 is turned on at time T13. As a result, the voltage V3 is applied to one end of the capacitor C1, a current flows from the output terminal of the operational amplifier 20 through the capacitor C2, the capacitor C1, and the switch SW0, toward the terminal $V_{SS}$ in this order, the electric charge corresponding to $V_{BV4}$ $(=V4-V3)$ is accumulated in the capacitor C2, so that the output voltage $V_{OUT}$ is increased.

While the electric charge of the capacitor C1 is in a stable state, $V_{C1}=V3-V_{REF1}-V_{OFF}$ is satisfied. Therefore, the variation $\Delta Q_{C1}$ of the electric charge $Q_{C1}$ of the capacitor C1 is expressed by $\Delta Q_{C1}=(V4-V_{REF1}-V_{OFF})\cdot C1-(V3-V_{REF1}-V_{OFF})\cdot C1=V_{BV4}\cdot C1$. Since the electric charge same as $\Delta Q_{C1}$ is accumulated in the capacitor C2, the electric charge $Q_{C2}$ of the capacitor C2 is expressed by $Q_{C2}=V_{BV4}\cdot C1$. Therefore, the voltage $V_{C2}$ across the capacitor C2 is expressed by $V_{C2}=V_{BV4}\cdot C1/C2$, and the output voltage $V_{OUT}$ is expressed by $V_{OUT}=V_{REF1}+V_{OFF}+V_{C2}=V_{REF1}+V_{OFF}+V_{BV4}\cdot C1/C2$.

At time T14, the switch SW3 is turned off and the signal CHG goes high. Since the signal CHG goes high, the P-channel MOSFET 45 is turned off and the constant current according to the current generated by the current source 47 flows from the P-channel MOSFET 44 through the capacitor C2 toward the output terminal of the operational amplifier 20. This constant current causes the electric charge accumulated in the capacitor C2 to be discharged at a constant speed, and the output voltage $V_{OUT}$ is reduced at a constant speed. Since the signal CHG goes high, the counter 50 starts counting up of the count value CNT based on the clock signal CLK.

Thereafter, when the output voltage $V_{OUT}$ becomes lower than the threshold voltage 0.7 V $(=V_{REF1}-V_{OFF})$ of the comparator 25 at time T15, the output signal CMP of the comparator 25 goes low and the counter 50 stops counting. As a result of this, the microcomputer 55 can measure time $T_{BV4}$ between times T14 and T15. When the signal CHG goes low at time T16, the P-channel MOSFET 45 is turned on and the discharging of the capacitor C2 caused by the constant current stops.

The microcomputer 55 may obtain the voltage $V_{BV4}$ of the battery BV4 based on $T_{0V}$, $T_{REF2}$, and $T_{BV4}$ measured by the counter 50. Specifically, a time obtained by subtracting $T_{0V}$ from $T_{REF2}$ is a time corresponding to the voltage $V_{REF2}$, and a time obtained by subtracting $T_{0V}$ from $T_{BV4}$ is a time corresponding to the voltage $V_{BV4}$. Therefore, a relationship of $V_{BV4}/V_{REF2}=(T_{BV4}-T_{0V})/(T_{REF2}-T_{0V})$ is satisfied, resulting in $V_{BV4}=\{(T_{BV4}-T_{0V})/(T_{REF2}-T_{0V})\}/V_{REF2}$.

The voltage $V_{BV4}$ is obtained by comparing count values between $T_{REF2}$ in a case of the reference voltage $V_{REF2}$ and $T_{BV4}$ in a case of the voltage $V_{BV4}$ of the battery BV4, and thus, the detection accuracy of the battery voltage may be improved. For example, when the clock signal CLK is generated by a circuit with lower accuracy such as an RC oscillation circuit, if the voltage $V_{BV4}$ of the battery BV4 is obtained based on only $T_{BV4}$ measured by the counter 50, the detection accuracy of the voltage $V_{BV4}$ is reduced due to an effect of variation in a clock frequency caused by temperature change, etc.

Therefore, the effect of the variation in the clock frequency may be canceled and the battery voltage may accurately be detected by comparing with the count value $T_{REF2}$ in the case of the predetermined reference voltage $V_{REF2}$ as shown in an embodiment of the present invention.

At time T16, the switches SW3 and SW6 are turned on. Since the switch SW6 is turned on, the output voltage $V_{OUT}$ is set to 0.9 V (=$V_{REF1}$+$V_{OFF}$), and the output signal CMP of the comparator 25 goes high. Since the switch SW6 is turned on, the voltage $V_{C2}$ across the capacitor C2 is set to $V_{C2}$=0 V. Since the switch SW3 is turned on, the voltage $V_{C1}$ across the capacitor C1 is set to $V_{C1}$=V3−$V_{REF1}$−$V_{OFF}$.

Thereafter, the switches SW3 and SW6 are turned off at time T17 and then the switch SW2 is turned on at time T18. As a result, the voltage V2 is applied to one end of the capacitor C1, a current flows from the output terminal of the operational amplifier 20 through the capacitor C2, the capacitor C1, and the switch SW0 toward the terminal $V_{SS}$ in this order, the electric charge corresponding to $V_{BV3}$ (=V3−V2) is accumulated in the capacitor C2, and the voltage $V_{BV3}$ is detected. The voltage $V_{BV2}$ and the voltage $V_{BV1}$ are subsequently detected by similar processing.

Second Embodiment

=Circuit Configuration=

Figure 5:
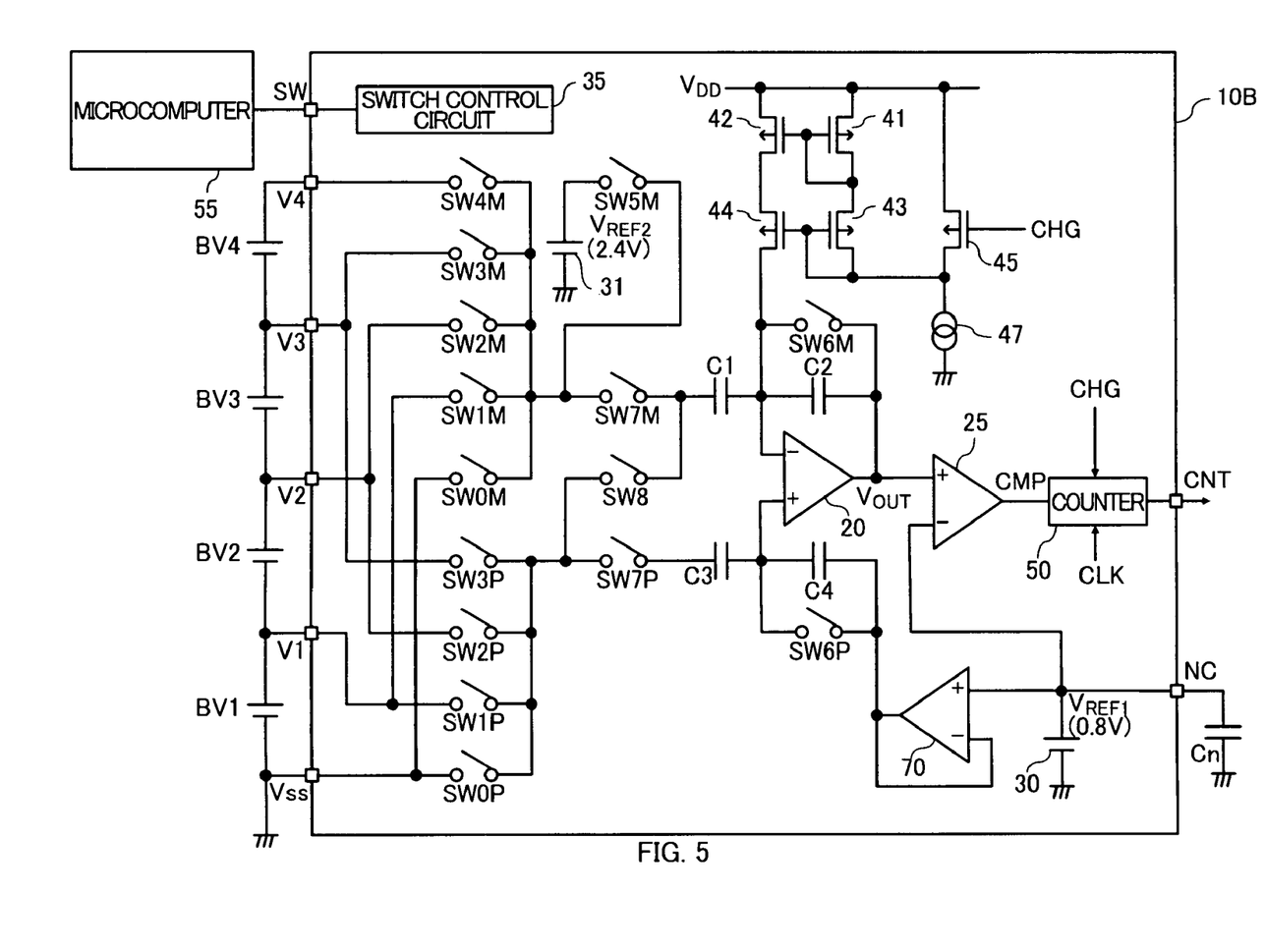
FIG. 5 is a diagram of a configuration of a battery voltage detection circuit that is a second embodiment of the present invention.

FIG. 5 is a diagram showing a configuration of a battery voltage detection circuit that is a second embodiment of the present invention. A battery voltage detection circuit 10B is obtained by modifying the battery voltage detection circuit 10A according to a first embodiment of the present invention so as to have a differential configuration. Specifically, the battery voltage detection circuit 10B includes switches SW0P to SW3P, SW6P, SW7P, SW0M to SW7M, SW8, and an operational amplifier 70 instead of the switches SW0 to SW6 of the battery voltage detection circuit 10A. The battery voltage detection circuit 10B also includes capacitors C3 and C4 in addition to the capacitor C1 and C2 of the battery voltage detection circuit 10A according to a first embodiment of the present invention. The switches SW0P to SW3P, SW7P, SW0M to SW5M, SW7M, and SW8 correspond to a voltage application circuit according to an embodiment of the present invention and the switches SW6P and SW6M correspond to a discharge circuit according to an embodiment of the present invention.

=Operation=

Figure 6:
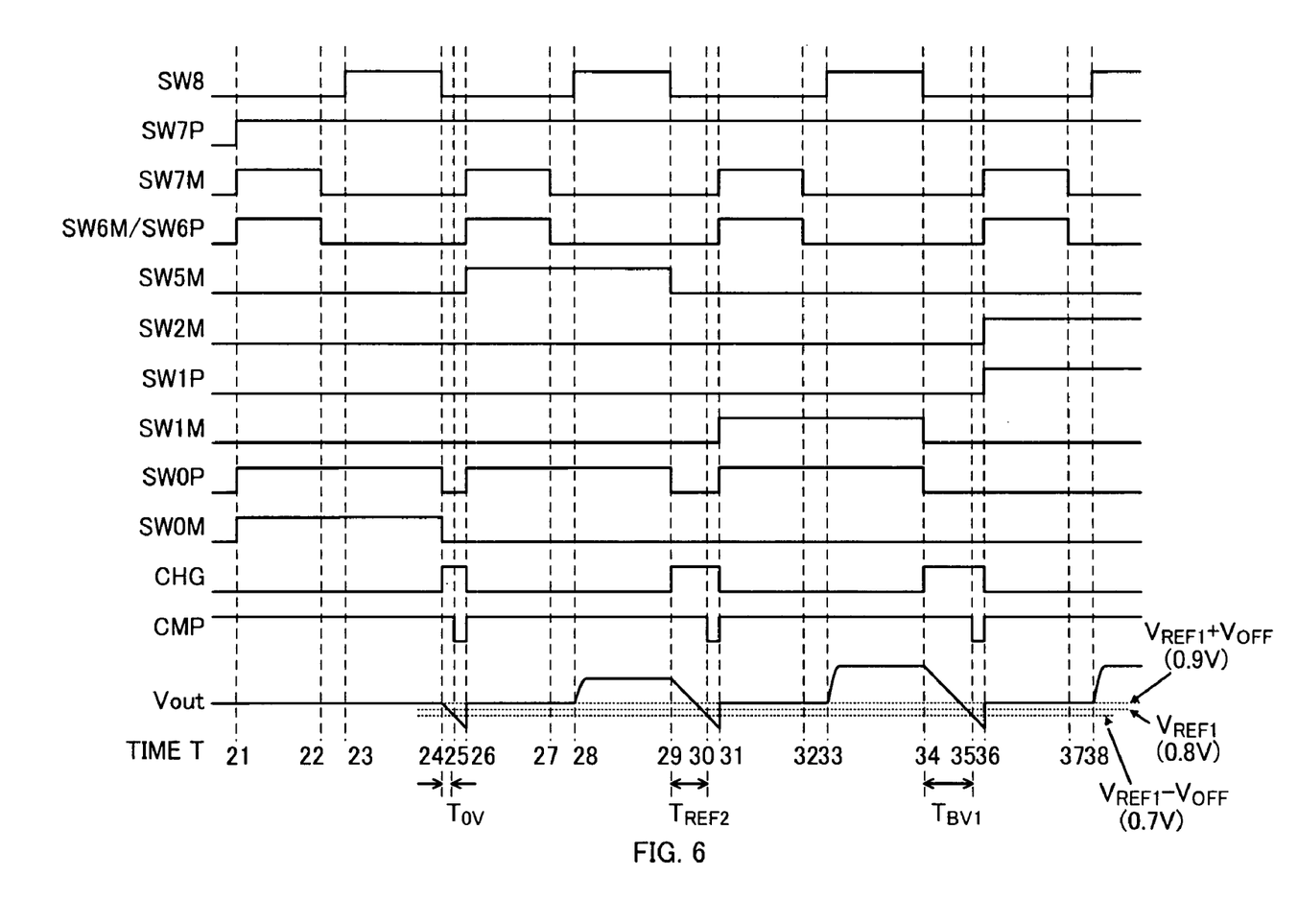
FIG. 6 is a timing chart of an example of an operation of a battery voltage detection circuit of a second embodiment.

An operation of the battery voltage detection circuit 10B will be described. FIG. 6 is a timing chart of an example of an operation of the battery voltage detection circuit 10B. The capacitances of the capacitors C1 to C4 are denoted as C1 to C4, respectively, and it is assumed that a relationship of C1/C2=C3/C4 is satisfied. The switches SW0P to SW3P, SW6P, SW7P, SW0M to SW7M, and SW8 are controlled by a switch control circuit 35 and it is assumed that a turned-on state corresponds to high and a turned-off state corresponds to low. The switches SW2P, SW3M, SW3P, and SW4M are turned off during a time period shown in FIG. 6.

At time T21, the switches SW0M, SW0P, SW6M, SW6P, SW7M, and SW7P are turned on and the switches SW1P to SW3P, SW1M to SW5M, and SW8 are turned off.

Since the switches SW6M and SW6P are turned on, the operational amplifier 20 acts as an amplifier having a gain 1, and an output voltage $V_{OUT}$ of 0.9 V is output, which is obtained by adding an offset voltage $V_{OFF}$ to a reference voltage $V_{REF1}$ applied to the positive input terminal through the operational amplifier 70 that is a buffer amplifier. Since a threshold voltage of a comparator 25 is 0.7 V, which is lower than the reference voltage $V_{REF1}$ by the offset voltage $V_{OFF}$, an output signal CMP remains high. Since the switches SW6M and SW6P are turned on, the capacitors C2 and C4 discharge. Since the switches 0M, SW0P, SW7M, and SW7P are turned on, the ground voltage $V_{SS}$ (=0 V) is applied to each of the other ends of the capacitors C1 and C3.

Thereafter, the switches SW6M, SW6P, and SW7M are turned off at time T22 and the switch SW8 is turned on at time T23. Since the voltage applied to the capacitor C1 is not changed, the voltages across the capacitors C1 and C2 and the output voltage $V_{OUT}$ are not changed.

The switches SW0M, SW0P, and SW8 are turned off at time T24 and a signal CHG goes high. Since the signal CHG goes high, the capacitor C2 discharges at a constant speed, and the output voltage $V_{OUT}$ is reduced at a constant speed. Since the signal CHG goes high, a counter 50 starts counting up of a count value CNT based on a clock signal CLK.

Thereafter, when the output voltage $V_{OUT}$ becomes lower than 0.7 V which is the threshold voltage of the comparator 25 at time T25, the output signal CMP goes low and the counter 50 stops counting. As a result of this, a microcomputer 55 can measure time $T_{0V}$ between times T24 and T25. The measured time $T_{0V}$ is a time corresponding to the grounding voltage $V_{SS}$ (=0 V). When the signal CHG goes low at time T26, the P-channel MOSFET 45 is turned on and discharging of the capacitor C2 caused by the constant current stops.

At time T26, the switches SW0P, SW5M, SW6M, SW6P, and SW7M are turned on. Since the switches SW6M and SW6P are turned on, the voltages $V_{C2}$ and $V_{C4}$ across the capacitors C2 and C4 are set to 0 V, the output voltage $V_{OUT}$ is set to 0.9 V, and the output signal CMP of the comparator 25 goes high. Since the switch SW5M is turned on, a reference voltage $V_{REF2}$ output from a power source 31 is applied to one end of the capacitor C1, and a voltage $V_{C1}$ across the capacitor C1 is set to $V_{C1}$=$V_{REF2}$−$V_{REF1}$−$V_{OFF}$.

Thereafter, the switches SW6M, SW6P, and SW7M are turned off at time T27 and the switch SW8 is turned on at time T28. As a result, the ground voltage $V_{SS}$ (0 V) is applied to the other end of the capacitor C1, a current flows from the output terminal of the operational amplifier 20 through the capacitor C2, the capacitor C1, the switch SW8, and the switch SW0P toward a terminal $V_{SS}$ in this order, and the electric charge corresponding to the reference voltage $V_{REF2}$ is accumulated in the capacitor C2, so that the output voltage $V_{OUT}$ is increased.

While the electric charge of the capacitor C1 is in a stable state, $V_{C1}$=$V_{SS}$−$V_{REF1}$−$V_{OFF}$ is satisfied. Therefore, a variation $\Delta Q_{C1}$ of the electric charge $Q_{C1}$ of the capacitor C1 is expressed by $\Delta Q_{C1}$=($V_{REF2}$−$V_{REF1}$−$V_{OFF}$)·C1−($V_{SS}$−$V_{REF1}$−$V_{OFF}$)·C1=$V_{REF2}$·C1. Since the electric charge same as $\Delta Q_{C1}$ is accumulated in the capacitor C2, the electric charge $Q_{C2}$ of the capacitor C2 is expressed by $Q_{C2}$=$V_{REF2}$·C1. Therefore, the voltage $V_{C2}$ across the capacitor C2 is set to $V_{C2}$=$V_{REF2}$·C1/C2, and the output voltage $V_{OUT}$ is set to $V_{OUT}$=$V_{REF1}$+$V_{OFF}$+$V_{C2}$=$V_{REF1}$+$V_{OFF}$+$V_{REF2}$·C1/C2.

At time T29, the switches SW0P, SW5M, and SW8 are turned off and the signal CHG goes high. Since the signal CHG goes high, the capacitor C2 discharges at a constant speed, and the output voltage $V_{OUT}$ is reduced at a constant speed. Since the signal CHG goes high, the counter 50 starts counting up of the count value CNT based on the clock signal CLK.

Thereafter, when the output voltage $V_{OUT}$ becomes lower than the threshold voltage 0.7 V of the comparator 25 at time T30, the output signal CMP goes low and the counter 50 stops counting. As a result of this, the microcomputer 55 can measure time $T_{REF2}$ between times T29 and T30. When the signal CHG goes low at time T31, the P-channel MOSFET 45 is turned on and the discharging of the capacitor C2 caused by the constant current stops.

At time T31, the switches SW0P, SW1M, SW6M, SW6P, and SW7M are turned on. Since the switches SW6M and SW6P are turned on, the voltages $V_{C2}$ and $V_{C4}$ across the capacitors C2 and C4 are set to 0 V, the output voltage $V_{OUT}$ is set to 0.9 V, and the output signal CMP of the comparator 25 goes high. Since the switches SW1M and SW7M are turned on, the voltage $V_{C1}$ across the capacitor C1 is set to $V_{C1}=V1-V_{REF1}-V_{OFF}$.

Thereafter, the switches SW6M, SW6P, and SW7M are turned off at time T32 and the switch SW8 is turned on at time T33. As a result, the ground voltage $V_{SS}$ (0 V) is applied to the other end of the capacitor C1, a current flows from the output terminal of the operational amplifier 20 through the capacitor C2, the capacitor C1, the switch SW8, and the switch SW0P toward the terminal $V_{SS}$ in this order, and the electric charge corresponding to a voltage $V_{BV1}$ is accumulated in the capacitor C2.

At time T34, SW0P, SW1M, and SW8 are turned off and the signal CHG goes high. Since the signal CHG goes high, the capacitor C2 discharges at a constant speed, and the output voltage $V_{OUT}$ is reduced at a constant speed. When the output voltage $V_{OUT}$ becomes lower than the threshold voltage 0.7 V of the comparator 25 at time T35, the output signal CMP goes low and the counter 50 stops counting. As a result of this, the microcomputer 55 can measure time $T_{BV1}$ between times T34 and T35. When the signal CHG goes low at time T36, the P-channel MOSFET 45 is turned on and the discharging of the capacitor C2 caused by the constant current stops.

The microcomputer 55 may obtain the voltage $V_{BV1}$ of the battery BV1 based on $T_{0V}$, $T_{REF2}$, and $T_{BV1}$ measured by the counter 50.

At time T36, the switches SW1P, SW2M, SW6M, SW6P, and SW7M are turned on. Since the switches SW6M and SW6P are turned on, the voltages $V_{C2}$ and $V_{C4}$ across the capacitors C2 and C4 is set to 0 V, the output voltage $V_{OUT}$ is set to 0.9 V, and the output signal CMP of the comparator 25 goes high. Since the switches SW2M and SW7M are turned on, the voltage $V_{C1}$ across the capacitor C1 is set to $V_{C1}=V2-V_{REF1}-V_{OFF}$.

Thereafter, the switches SW6M, SW6P, and SW7M are turned off at time T37 and the switch SW8 is turned on at time T38. As a result, the voltage V1 is applied to the other end of the capacitor C1, a current flows from the output terminal of the operational amplifier 20 through the capacitor C2, the capacitor C1, the switch SW8, and the switch SW1P toward a terminal V1 in this order, and the electric charge corresponding to a voltage $V_{BV2}$ (=V2−V1) is accumulated in the capacitor C2, so that the voltage $V_{BV2}$ is detected. A voltage $V_{BV3}$ and a voltage $V_{BV4}$ are subsequently detected by similar processing.

If the batteries BV1 to BV4 are used for a drive power source of a notebook computer, for example, the voltages V1 to V4 may concurrently be reduced to the same extent when a processing load, etc., are increased. For example, it is assumed that after the capacitor C2 is started being charged at time T33 and the output voltage $V_{OUT}$ becomes in the stable sate, a phenomenon occurs in which the voltage V1 is reduced to V1'. As a result of this, the voltage applied to the other end of the capacitor C1 is reduced from V1 to V1', and thus, a current further flows from the output terminal of the operational amplifier 20 through the capacitor C2, the capacitor C1, the switch SW8, and the switch SW1P toward the terminal V1 in this order. Since the voltage applied to the other end of the capacitor C3 is also reduced from V1 to V1', a current flows from the output terminal of the operational amplifier 70 through the capacitor C4, the capacitor C3, the switch SW7P, and the switch SW1P toward the terminal V1 in this order.

In this case, a variation $\Delta Q_{C3}$ of an electric charge $Q_{C3}$ of the capacitor C3 is expressed by $\Delta Q_{C3}=(V1-V1')\cdot C3$. Since the electric charge same as $\Delta Q_{C3}$ is accumulated in the capacitor C4, an electric charge $Q_{C4}$ of the capacitor C4 is expressed by $Q_{C4}=(V1-V1')\cdot C3$. Therefore, the voltage $V_{C4}$ across the capacitor C4 is expressed by $V_{C4}=(V1-V1')\cdot C3/C4$, and the voltage $V^+$ applied to the positive input terminal of the operational amplifier 20 is expressed by $V^+=V_{REF1}-V_{C4}$. The variation $\Delta Q_{C1}$ of the electric charge $Q_{C1}$ of the capacitor C1 expressed by $\Delta Q_{C1}=(V1-V1')\cdot C1$. Since the electric charge same as $\Delta Q_{C1}$ is further accumulated in the capacitor C2, the electric charge $Q_{C2}$ of the capacitor C2 is expressed by $Q_{C2}=(V2-V1)\cdot C1+(V1-V1')\cdot C1=(V2-V1')\cdot C1$. Therefore, the voltage $V_{C2}$ across the capacitor C2 is set to $V_{C2}=(V2-V1')\cdot C1/C2$, and the voltage $V^-$ applied to the negative input terminal of the operational amplifier 20 is set to $V^-=V^++V_{OFF}=V_{REF1}-V_{C4}+V_{OFF}-(V1-V1')\cdot C3/C4+V_{OFF}$. Therefore, the output voltage $V_{OUT}$ of the operational amplifier 20 is set to $V_{OUT}=V_{REF1}-(V1-V1')\cdot C3/C4+V_{OFF}+(V2-V1')\cdot C1/C2=V_{REF1}+(V2-V1)\cdot C1/C2+V_{OFF}=V_{REF1}-V_{BV2}\cdot C1/C2+V_{OFF}$, and it can be seen that reduction of the voltage V1 has no influence.

That is, if the voltages V1 to V4 are concurrently reduced, since the switch SW8 is turned on, the variations of the voltages are equal of the positive and negative input terminals of the operational amplifier 20, and the output voltage $V_{OUT}$ does not change, and thus, the voltage of the battery may accurately be detected in any timing. The operational amplifier 70 is provided in the battery voltage detection circuit 10B so that the operational amplifiers 70 and 20 are in symmetrical relation, thereby enhancing the detection accuracy.

There have been described battery voltage detection circuits 10A and 10B according to an embodiment of the present invention. As described above, in the battery voltage detection circuits 10A and 10B the capacitors C1 and C2 or the capacitors C1 to C4 are used instead of resistors for differential amplification using the operational amplifier 20. Therefore, direct-current voltages of the batteries BV1 to BV4 are not applied to the operational amplifier 20 and the operational amplifier 20 does not need high voltage endurance. Since the output voltage $V_{OUT}$ may be increased in level by adjusting a capacitance ratio among the capacitors C1 to C4, a highly-accurate AD converter is not necessary. Therefore, the battery voltage may be detected with high accuracy and lower costs.

In the battery voltage detection circuits 10A and 10B, one power source 30 is included as the power source circuit for generating the reference voltage for the operational amplifier 20 and the comparator 25 and a negative voltage can be detected. Therefore, when comparing with the case of providing respective power source circuits for the operational amplifier 20 and the comparator 25, the cost can be more reduced of taking the countermeasure of noise cutting for the power source circuit in order to enhance the detection accuracy of the battery voltage. The negative voltage is generated between the terminal V4 and the terminal V3 when the terminal V4 is short-circuited. That is, an abnormal state may be detected by detecting the negative voltage.

In the battery voltage detection circuits 10A and 10B, one power source 30 is included as the power source circuit for generating the reference voltage for the operational amplifier 20 and the comparator 25 and the time $T_{0V}$ corresponding to 0 V can be measured. Therefore, it is possible to detect the battery voltage with high accuracy by using the time $T_{0V}$ in consideration of influence of the offset voltages $V_{OFF}$ of the operational amplifier 20 and the comparator 25 upon measurement time.

In the battery voltage detection circuits 10A and 10B, a difference is generated between a voltage applied to the positive input terminal of the comparator 25 and a voltage applied to the negative input terminal thereof corresponding to the offset voltages $V_{OFF}$ of the operation amplifier 20 and the comparator 25 when the switch SW6 or the switches SW6M and SW6P are turned on, and thus, chattering may be prevented from occurring in the output signal CMP of the comparator 25.

In the battery voltage detection circuits 10A and 10B, for example, the operational amplifier 20 can be applied with the offset by making two transistors different in size which make up the differential transistor pair in the operational amplifier 20, for example. That is, just the changing in size of the transistors without adding a new circuit is enough, and thus, the costs may be restrained from being increased and one power source may be provided for generating the reference voltage for the operational amplifier 20 and the comparator 25.

Similarly, in the battery voltage detection circuits 10A and 10B, the comparator 25 can be applied with the offset by making two transistors different in size which make up the differential transistor pair in the comparator 25, for example. That is, just the changing in size of the transistors without adding a new circuit is enough, and thus, the costs may be restrained from being increased and one power source may be provided for generating the reference voltage for the operational amplifier 20 and the comparator 25.

The above embodiments of the present invention are simply for facilitating the understanding of the present invention and are not in any way to be construed as limiting the present invention. The present invention may variously be changed or altered without departing from its spirit and encompass equivalents thereof.

For example, although both the operational amplifier 20 and the comparator 25 are applied with the offset in an embodiment of the present invention, either the operational amplifier 20 or the comparator 25 may be applied with the offset so that the logic level is changed in the output signal CMP of the comparator 25 when the voltage applied to the negative input terminal of the operational amplifier 20 is set to a voltage of a predetermined level lower than the reference voltage $V_{REF1}$.

What is claimed is:

1. A battery voltage detection circuit comprising:
   a first capacitor;
   an operational amplifier having one input terminal to be applied with a reference voltage and the other input terminal connected to one end of the first capacitor;
   a second capacitor having one end connected to an output terminal of the operational amplifier and the other end connected to the other input terminal of the operational amplifier;
   a voltage application circuit configured to sequentially apply a voltage of one terminal of a battery and a voltage of the other terminal of the battery to the other end of the first capacitor;
   a discharge circuit configured to allow the second capacitor to discharge before the voltage of the other terminal of the battery is applied to the other end of the first capacitor;
   a constant current circuit configured to output a constant current causing electric charge accumulated in the second capacitor to be discharged at a predetermined speed, in response to a discharge start signal input after the voltage is applied to the other end of the first capacitor;
   a comparator having one input terminal to be applied with the reference voltage and the other input terminal connected to the output terminal of the operational amplifier; and
   a measurement circuit configured to measure a time period from a time when the discharge start signal is input until a time when an output signal of the comparator changes to one logic level, as a time period corresponding to a voltage of the battery,
   at least one of the operational amplifier and the comparator being provided with an offset so that the output signal of the comparator changes to the one logic level when the voltage applied to the other input terminal of the operational amplifier is a voltage of a predetermined level lower than a level of the reference voltage.

2. The battery voltage detection circuit of claim 1, wherein
   the voltage application circuit is capable of applying a ground voltage to the other end of the first capacitor, wherein
   the discharge circuit allows the second capacitor to discharge before the ground voltage is applied to the other end of the first capacitor, and wherein
   when the ground voltage is applied to the other end of the first capacitor, the measurement circuit measures a time period from a time when the discharge start signal is input until a time when the logic level of the output signal of the comparator changes, as a time period corresponding to the ground voltage.

3. The battery voltage detection circuit of claim 1, wherein
   the discharge circuit includes a switch circuit configured to connect between the other input terminal of the operational amplifier and the output terminal of the operational amplifier when the output signal of the comparator is at the one logic level.

4. The battery voltage detection circuit of claim 1, wherein
   the operational amplifier includes a differential transistor pair of one transistor having a control electrode serving as the one input terminal of the operational amplifier and the other transistor having a control electrode serving as the other input terminal of the operational amplifier, and wherein
   the one transistor and the other transistor in the operational amplifier are made different in size so that the output signal of the comparator changes to the one logic level when the voltage applied to the other input terminal of the operational amplifier is the voltage of the predetermined level lower than the level of the reference voltage.

5. The battery voltage detection circuit of claim 1, wherein
   the comparator includes a differential transistor pair of one transistor having a control electrode serving as the one input terminal of the comparator and the other transistor having a control electrode serving as the other input terminal thereof, and wherein
   the one transistor and the other transistor in the comparator are made different in size so that the output signal of the comparator changes to the one logic level when the voltage applied to the other input terminal of the operational amplifier is the voltage of the predetermined level lower than the level of the reference voltage.

* * * * *